United States Patent
Kim et al.

(10) Patent No.: US 9,487,165 B2
(45) Date of Patent: Nov. 8, 2016

(54) PROGRAMMABLE DYNAMIC VOLTAGE CONTROL APPARATUS

(71) Applicant: Hyundai Autron Co., Ltd., Seongnam-si (KR)

(72) Inventors: Jong-ho Kim, Suwon-si (KR); Gyu-Cheol Jo, Gunpo-si (KR); Young-Sik Park, Seongnam-si (KR); Hui-Yul Kang, Suwon-si (KR); Myung-Sang Ryu, Yongin-si (KR); Hyun-Cheol Choi, Seoul (KR); Myung-Su Yu, Suwon-si (KR); Won-Do Kim, Bucheon-si (KR); Jin-Young Park, Gwacheon-si (KR)

(73) Assignee: HYUNDAI AUTRON CO., LTD., Seongnam-Si (KR)

(\*) Notice: Subject to any disclaimer, the term of this patent is extended or adjusted under 35 U.S.C. 154(b) by 541 days.

(21) Appl. No.: 14/132,468

(22) Filed: Dec. 18, 2013

(65) Prior Publication Data

US 2015/0091376 A1 Apr. 2, 2015

(30) Foreign Application Priority Data

Oct. 2, 2013 (KR) .................. 10-2013-0117986

(51) Int. Cl.
*B23K 11/24* (2006.01)
*B60R 16/03* (2006.01)
*H03M 1/66* (2006.01)

(52) U.S. Cl.
CPC ............... *B60R 16/03* (2013.01); *H03M 1/66* (2013.01)

(58) Field of Classification Search
CPC .................. B60R 16/03; H03M 1/66
See application file for complete search history.

(56) References Cited

U.S. PATENT DOCUMENTS

| | | | |
|---|---|---|---|
| 6,292,125 B1 | 9/2001 | Conroy | |
| 2004/0263366 A1* | 12/2004 | Yada | H03M 1/1023 341/118 |
| 2009/0033535 A1* | 2/2009 | Horie | H03G 1/0094 341/150 |
| 2011/0109487 A1 | 5/2011 | Agi | |

FOREIGN PATENT DOCUMENTS

| KR | 10-2005-0104599 A | 11/2005 |
|---|---|---|
| KR | 10-2009-0088257 A | 8/2009 |

OTHER PUBLICATIONS

Deutsches Patent and Management Office, Office Action for German Patent Application No. 10 2013 226 330.9, Nov. 10, 2015.

\* cited by examiner

*Primary Examiner* — Daniel Cavallari
(74) *Attorney, Agent, or Firm* — Mayer Brown LLP; Hyunho Park

(57) ABSTRACT

The present invention relates to a programmable dynamic voltage control apparatus, and more particularly, to a programmable dynamic voltage control apparatus which is capable of dynamically controlling voltage conversion of an output unit using data set in programmable memories, when various pieces of information sensed by a variety of sensors mounted in a vehicle are converted into electrical signals and then transmitted.

8 Claims, 10 Drawing Sheets

PROGRAMMABLE DYNAMIC VOLTAGE CONTROL APPARATUS

CROSS-REFERENCES TO RELATED APPLICATIONS

The present application claims priority to Korean application number 10-2013-0117986, filed on Oct. 2, 2013, which is incorporated by reference in its entirety.

BACKGROUND OF THE INVENTION

The present invention relates to a programmable dynamic voltage control apparatus, and more particularly, to a programmable dynamic voltage control apparatus which is capable of dynamically controlling voltage conversion of an output unit using data set in programmable memories, when various pieces of information sensed by a variety of sensors mounted in a vehicle are converted into electrical signals and then transmitted.

Recently, a semiconductor device mounted in a vehicle may include various circuits such as a digital/analog (D/A) converter circuit and a current generator circuit, which are mounted on one chip. The D/A converter circuit is mounted as an interface circuit between a digital circuit and an analog circuit, and the improvement in precision for linearity of an output analog signal has been requested.

FIG. 1 is a circuit diagram of a conventional resistor string-type D/A converter circuit. The D/A converter circuit 11 includes a divider circuit 12 having a plurality of resistors R1 to R8 corresponding to a 3-bit digital signal D2 to D0, a plurality of switches SW1 to SW6, and a plurality of inverters 13 to 15.

In the D/A converter circuit 11 configured in such a manner, the resistors R1 to R8 are added according to the bit number (=3) of the digital signal D2 to D0, and coupled in series between a high voltage VDD and a low voltage VSS. The switches SW3 and SW4 are coupled in parallel to the resistors R2 and R3 at the high voltage VDD, respectively, the switches SW5 and SW6 are coupled in parallel to the resistors R6 and R7 at the low voltage VSS, respectively, the gates of the switches SW3 and SW6 are configured to receive an inverted signal of the digital signal D0 through the inverter 15, and the gates of the switches SW4 and SW5 are configured to receive an inverted signal of the digital signal D1 through the inverter 14.

Thus, the D/A converter circuit 11 turns on/off the switches SW3 to SW6 according to the lower 2-bit digital signals D1 and D0, equally divides a voltage difference between the high voltage VDD and the low voltage VSS, and generates an analog signal Aout having a voltage of [(VDD-VSS)×(n/16)+VSS] corresponding to the digital input signal D2 to D0.

However, since the conventional D/A converter does not have a resistance value of 0Ω when the respective switches SW3 to SW4 are turned on, the added resistors are coupled to the switches and coupling wirings are added therebetween. Thus, a divided voltage to which a voltage difference between the high voltage VDD and the low voltage VSS is equally divided cannot be obtained. This may reduce the precision of conversion from the digital signal D2 to D0 to the analog signal Aout.

In this connection, Korean Patent Laid-open Publication No. 10-2000-0076576 published on Dec. 26, 2000 and referred to as Patent Document 1 has disclosed a voltage generator circuit and a D/A converter circuit, which are capable of dividing a voltage difference between a high voltage and a low voltage, generating a divided voltage, and obtaining an output with high precision.

According to Patent Document 1, the D/A converter circuit includes a voltage generator circuit configured to generate a plurality of output voltages corresponding to the bit number of a low-bit digital signal and a selector circuit configured to select one of the output voltages based on an upper-bit digital signal and generate an analog signal. The voltage generator circuit includes a first impedance element coupled to a first terminal to which a first voltage is supplied, a second impedance element having the same impedance as the first impedance element and coupled to a second terminal to which a second voltage is supplied, a third impedance element coupled between the first and second impedance elements and having a predetermined impedance, a first current source coupled to a first node between the first and third impedance elements, and a second current source coupled to a second node between the second and third impedance elements. The first and second current sources supply first and second control currents having a correlation value to the first and second nodes, maintain a voltage difference between the first and second nodes, and change the potentials of the respective nodes to potentials corresponding to the first and second control currents. Thus, the D/A converter circuit may obtain an output signal with high precision.

Furthermore, Japanese Patent Laid-open Publication No. 63-202131 published on Aug. 22, 1988 and referred to as Patent Document 2 has disclosed an A/D converter which corrects and outputs a digital signal based on a driving voltage stored in a nonvolatile memory unit.

According to Patent Document 2, the A/D converter includes an A/D conversion unit configured to convert an analog signal to a digital signal, a nonvolatile memory unit configured to store a driving voltage which is applied to the A/D conversion unit so as to drive the A/D conversion unit, and a correction unit configured to correct a digital signal outputted from the A/D conversion unit based on the driving voltage stored in the nonvolatile memory unit and output the corrected digital signal. Thus, the A/D converter may correct the digital signal based on the driving voltage stored in the nonvolatile memory unit.

In the conventional converter circuits, however, the former converter has high precision, but cannot rapidly perform dynamic voltage control when the dynamic voltage control is required. Furthermore, in the case of the latter converter, a microprocessor may perform A/D conversion using a voltage programmed in EEPROM, but does not dynamically convert or control a signal of a sensor, transmitted from an output terminal. Thus, the converter cannot be applied to an electronic system for vehicle, which requires dynamic voltage conversion or control.

Patent Document 1: Korean Patent Laid-open Publication No. 10-2000-0076576 published on Dec. 26, 2000

Patent Document 2: Japanese Patent Laid-open Publication No. 63-202131 published on Aug. 22, 1988

SUMMARY OF THE INVENTION

Embodiments of the present invention are directed to a programmable dynamic voltage control apparatus which is capable of dynamically controlling voltage conversion of an output unit using data set in programmable memories when various pieces of information sensed by a variety of sensors mounted in a vehicle are converted into electrical signals and then transmitted by an analog transmission method and a digital transmission method, thereby simplifying the entire system to reduce a cost and improving the operation efficiency of engineering.

In an embodiment, a programmable dynamic voltage control apparatus includes: an n-bit channel data storage unit configured to store an n-bit digital input channel selection number and one or more programmable dynamic data for setting divided voltages corresponding to the n-bit digital input channel selection number, and provide the n-bit digital input channel selection number and the stored dynamic data for setting the $2^n$ divided voltages to a voltage division unit; the voltage division unit configured to equally divide an input voltage to generate $2^N$ divided voltages $V_M(i)$ where i ranges from 1 to $2^N$ and N is the number of necessary steps, select the $2^n$ divided voltages corresponding to the n-bit digital input channel selection number from the $2^N$ divided voltages $V_M(i)$ through the programmable dynamic data provided from the n-bit channel data storage unit 110, and maps the selected $2^n$ divided voltages to $2^n$ applied voltages V(j) of a D/A conversion unit; and the D/A conversion unit configured to be turned on/off by receiving the $2^n$ applied voltage V(j) mapped through the programmable dynamic data and receiving a digital sensor signal sensed through a sensor of a vehicle as input signals of n channels, and output an analog signal corresponding to the digital input signal of each channel.

The n-bit channel data storage unit may include a non-volatile RAM which maintains data stored therein even though power supply is cut off, and may store the n-bit digital input channel selection number and the one or more programmable dynamic data for setting the $2^n$ divided voltages corresponding to the n-bit digital input channel selection number into n-bit channel memories corresponding to the respective n digital input channels The voltage division unit may include: a divided voltage generation unit including impedance strings to equally divide the input voltage into $2^N$ voltages and configured to generate $2^N$ divided voltages $V_M(i)$ at each node of the impedance strings where i ranges from 1 to $2^N$ and N is the number of necessary steps; and a divided voltage mapping unit configured to select the $2^n$ divided voltages corresponding to the n-bit digital input channel selection number from the $2^N$ divided voltages $V_M(i)$ of the divided voltage generation unit through the programmable dynamic data provided from the n-bit channel data storage unit, and map the selected $2^n$ divided voltages to the $2^n$ applied voltages V(j) of the D/A conversion unit.

The D/A conversion unit may include a plurality of switch strings each having a plurality of switches corresponding to the digital input signals of the n channels and arranged in parallel to correspond to the $2^n$ divided voltages according to the n-bit digital input channel selection number. The digital input signals of the n channels, sensed through the sensor of the vehicle, may be directly inputted to or inverted through inverters and then inputted to the gates of the switches forming each of the switch strings, and any one of the divided voltages corresponding to the digital input channel selection number may be selected and outputted according to the on/off operations of the respective switches of the switch string. The drain terminals of the respective switch strings may be commonly coupled to an input terminal of an op-amplifier to select and amplify one applied voltage V(j) for the n-th channel.

In accordance with the embodiment of the present invention, when the output unit converts signals sensed through various sensors mounted on the vehicle into electrical signals and then transmits the electrical signals, an input digital signal may be converted into an analog signal through the setting value stored in the storage unit. Thus, the voltage conversion of the output unit may be dynamically controlled by the programmable memory data. Therefore, the structure of an electronic system for brake, acceleration, or air pressure may be simplified to thereby reduce the cost, and the operation efficiency of engineering may be improved.

DESCRIPTION OF SPECIFIC EMBODIMENTS

Embodiments of the invention will hereinafter be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the invention into account and can be changed according to the custom or intention of users or operators. Therefore, definition of the terms should be made according to the overall disclosures set forth herein.

Figure 1:
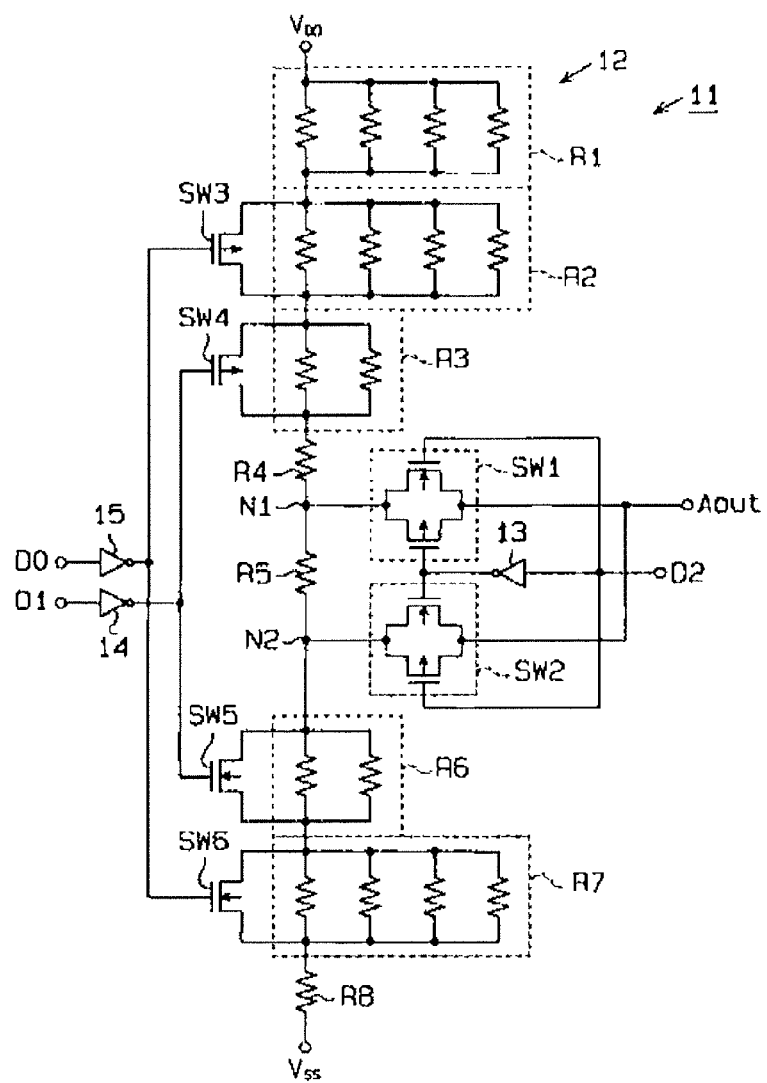
FIG. 1 is a circuit diagram of a conventional resistor string-type D/A converter circuit.
Figure 2:
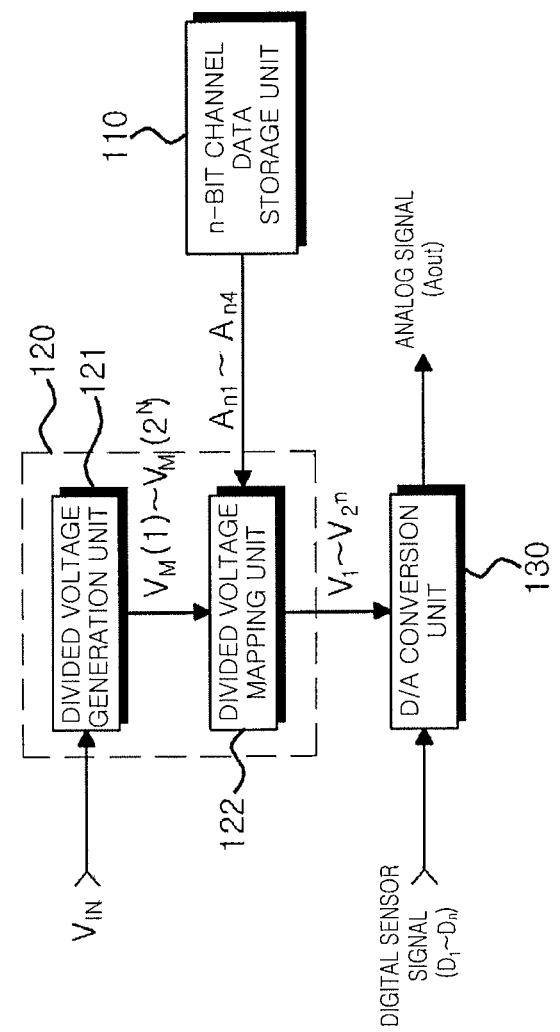
FIG. 2 is a block diagram schematically illustrating the configuration of a programmable dynamic voltage control apparatus in accordance with an embodiment of the present invention.

FIG. 2 is a block diagram schematically illustrating the configuration of a programmable dynamic voltage control apparatus in accordance with an embodiment of the present invention. Referring to FIG. 2, the programmable dynamic voltage control apparatus in accordance with the embodiment of the present invention may include an n-bit channel data storage unit 110, a voltage division unit 120, and a D/A conversion unit. The voltage division unit 120 may include a divided voltage generation unit 121 and a divided voltage mapping unit 122.

The n-bit channel data storage unit 110 stores one or more programmable dynamic data for setting n-bit digital input channel selection number and divided voltages corresponding to the n-bit digital input channel selection number, and provides the stored dynamic data for the n-bit digital input channel selection number and $2^n$ divided voltages corresponding to the n-bit digital input channel selection number to the voltage division unit 120.

The voltage division unit 120 equally divides an input voltage Vin to generate $2^N$ divided voltages $V_M(i)$ where i is 1 to $2^N$ and N is the number of necessary steps, selects $2^n$ divided voltages corresponding to the n-bit digital input channel selection number from the $2^N$ divided voltages $V_M(i)$ through programmable dynamic data provided from the n-bit channel data storage unit 110, and maps the selected $2^n$ divided voltages to $2^n$ applied voltages V(j) of the D/A conversion unit 130. The voltage division unit 120 includes a divided voltage generation unit 121 and a divided voltage mapping unit 122.

The D/A conversion unit 130 is turned on/off by receiving the $2^n$ applied voltage V(j) mapped through the programmable dynamic data from the voltage division unit 120 and receiving digital senor signals D1 to Dn sensed through a sensor of a vehicle as input signals of n channels, and outputs an analog signal Aout corresponding to the digital input signal of each channel.

Figure 3:
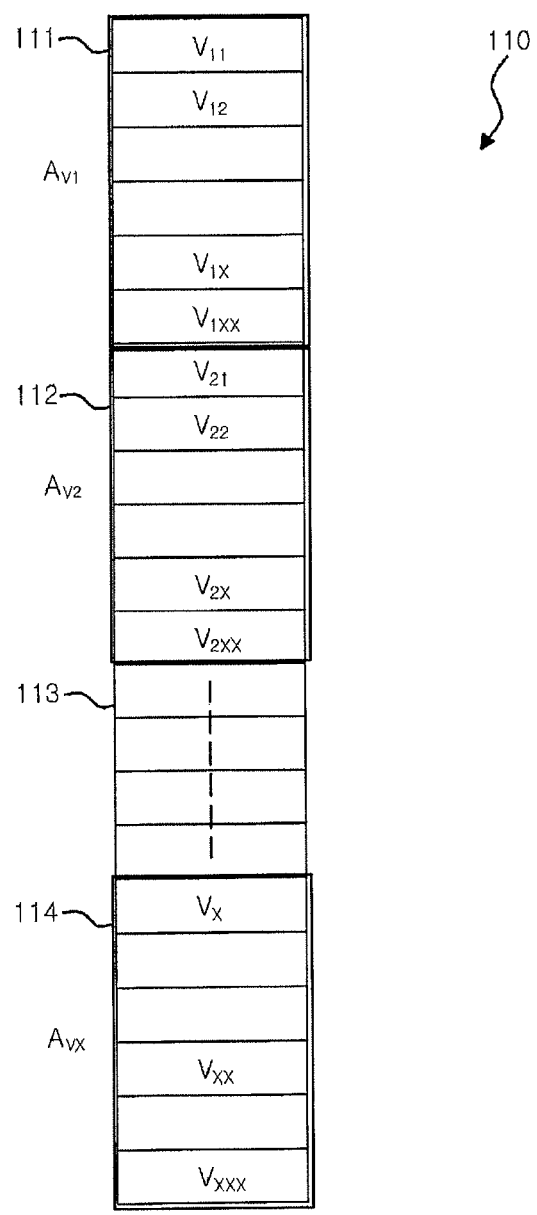
FIG. 3 is a diagram illustrating an example of n-bit channel memories forming an n-bit channel data storage unit of FIG. 2.

FIG. 3 is a diagram illustrating an example of n-bit channel memories forming the n-bit channel data storage unit of FIG. 2. Referring to FIG. 3, the n-bit channel data storage unit 110 includes n-bit channel memories 111 to 114, and stores one or more programmable dynamic data for setting the n-bit digital input channel selection number and the $2^n$ divided voltages corresponding to the n-bit digital input channel selection number into the n-bit channel memories 111 to 114 corresponding to n digital input channels. Table 1 shows the n-bit digital input channel selection number and the $2^n$ divided voltages corresponding to the n-bit digital input channel selection number, which are stored in the n-bit channel memories 111 to 114. The n-bit channel data storage unit 110 may be implemented with a nonvolatile RAM which maintains data stored therein even through power supply is cut off.

TABLE 1

|  | 8 | 16 | 32 | 64 | 128 | 256 | ... (divided voltage range) |
|---|---|---|---|---|---|---|---|
| 2 | 6(bit) | 8 | 10 | 12 | 14 | 16 |  |
| 4 | 12 | 16 | 20 | 24 | 28 | 32 |  |
| 6 | 18 | 24 | 30 | 36 | 42 | 48 |  |
| 8 | 24 | 32 | 40 | 48 | 56 | 64 |  |
| 16 | X | 65 | 80 | 96 | 112 | 128 |  |
| 32 | X | X | 160 | 192 | 224 | 256 |  |
| 64 | X | X | X | 384 | 448 | 512 |  |
| 128 | X | X | X | X | 896 | 1024 |  |
| ... (selected steps) |  |  |  |  |  |  |  |

Figure 4:
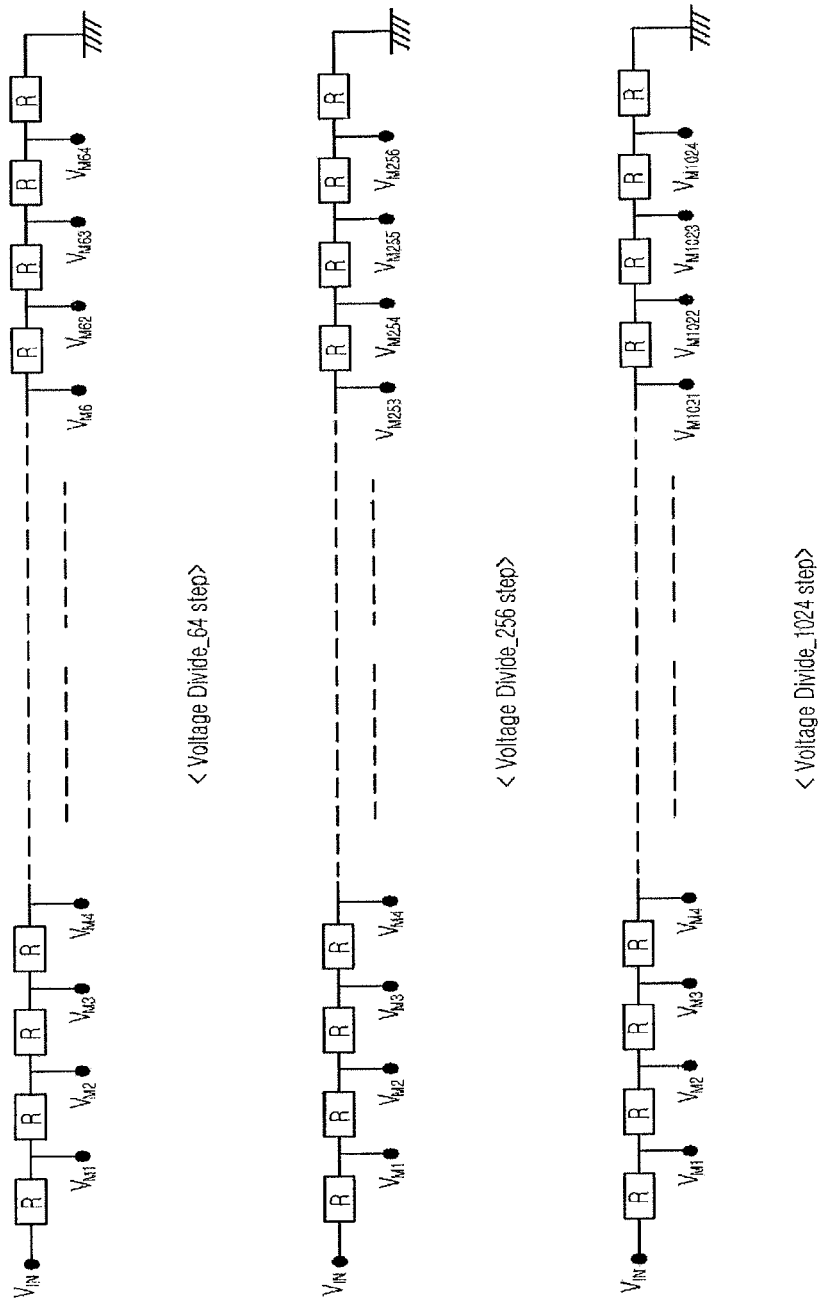
FIG. 4 is a circuit diagram illustrating an example in which a divided voltage generation unit included in a voltage division unit of FIG. 2 is implemented in 64 steps (a), 256 steps (b), and 1024 steps (c).

FIG. 4 is a circuit diagram illustrating an example in which the divided voltage generation unit forming the voltage division unit of FIG. 2 is implemented in 64 steps (a), 256 steps (b), and 1024 steps (c). The divided voltage generation unit 121 includes an impedance string to equally divide the input voltage Vin into $2^N$ voltages, and generates $2^N$ divided voltages $V_M(i)$ through a plurality of nodes of the impedance string, respectively, where i ranges from 1 to $2^N$. The divided voltage generation unit 121 includes the impedance string having ($2^N$+1) impedance elements for equally dividing the input voltage Vin into $2^N$ divided voltages $V_M(i)$, and the nodes between the respective impedance elements of the impedance string generate the $2^N$ divided voltages $V_M(i)$ where i ranges from 1 to $2^N$ and N is the number of necessary steps. The respective impedance elements forming the impedance string may be implemented with resistors R having the same impedance, and the number of impedance elements may be previously reflected and designed by the number of necessary steps.

Figure 5A:
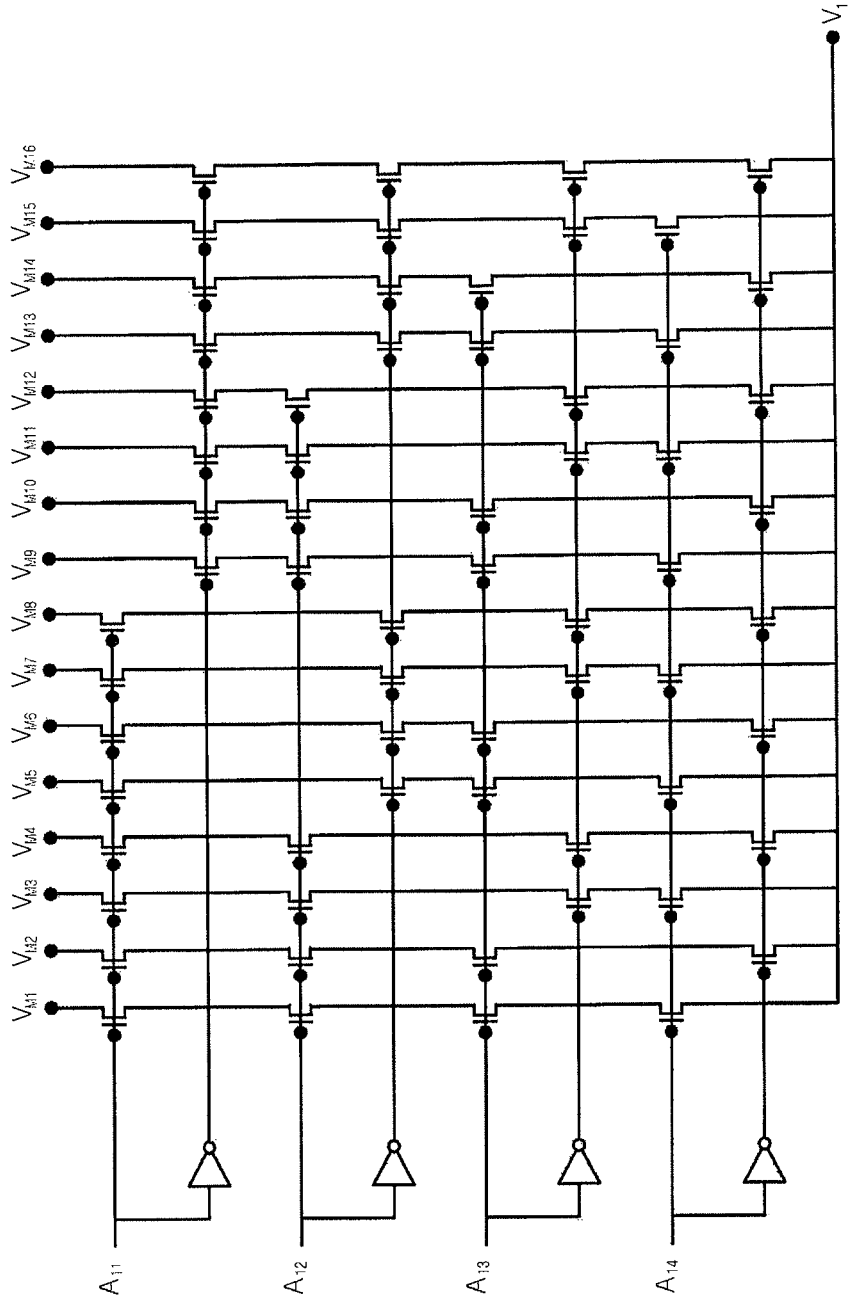
FIGS. 5A to 5D are circuit diagrams of a divided voltage mapping unit included in the voltage division unit of FIG. 2.
Figure 5B:
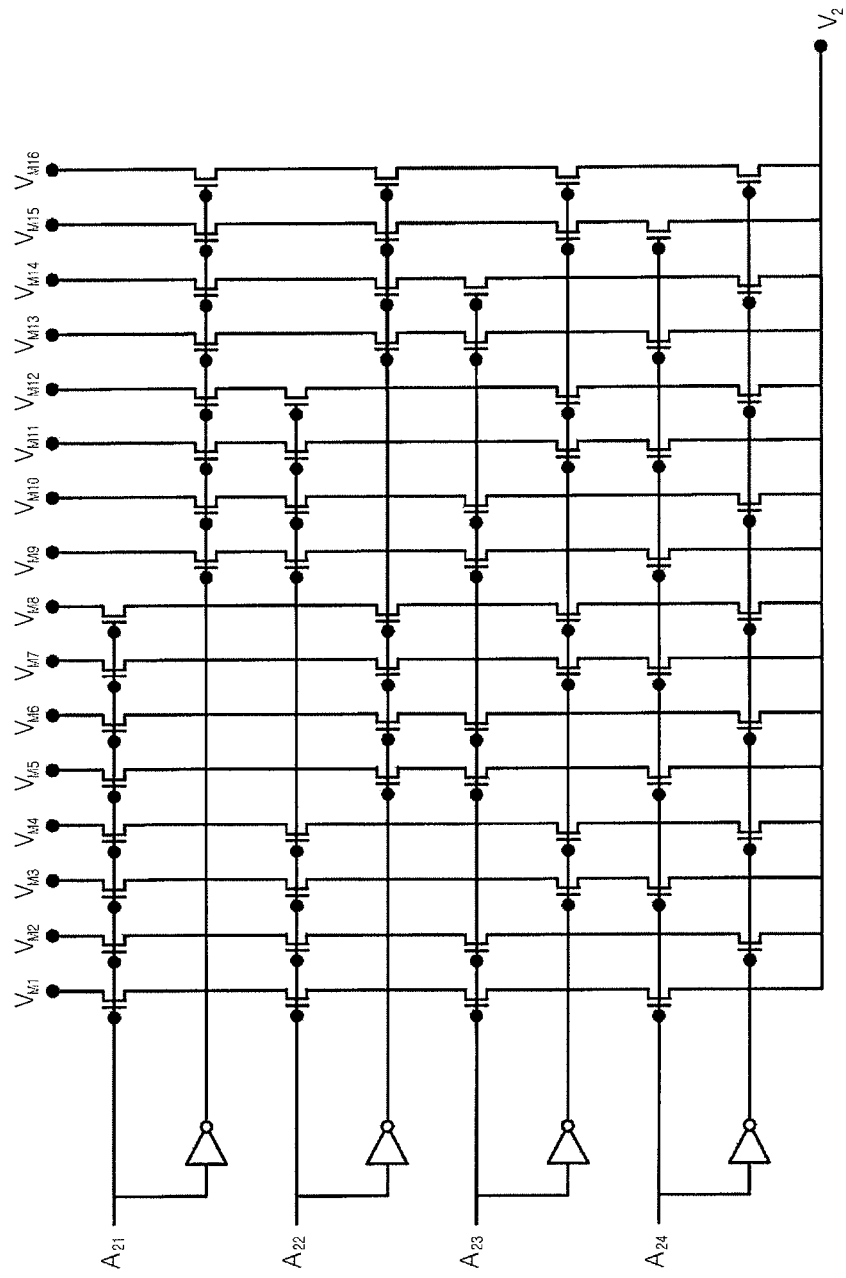
Figure 5C:
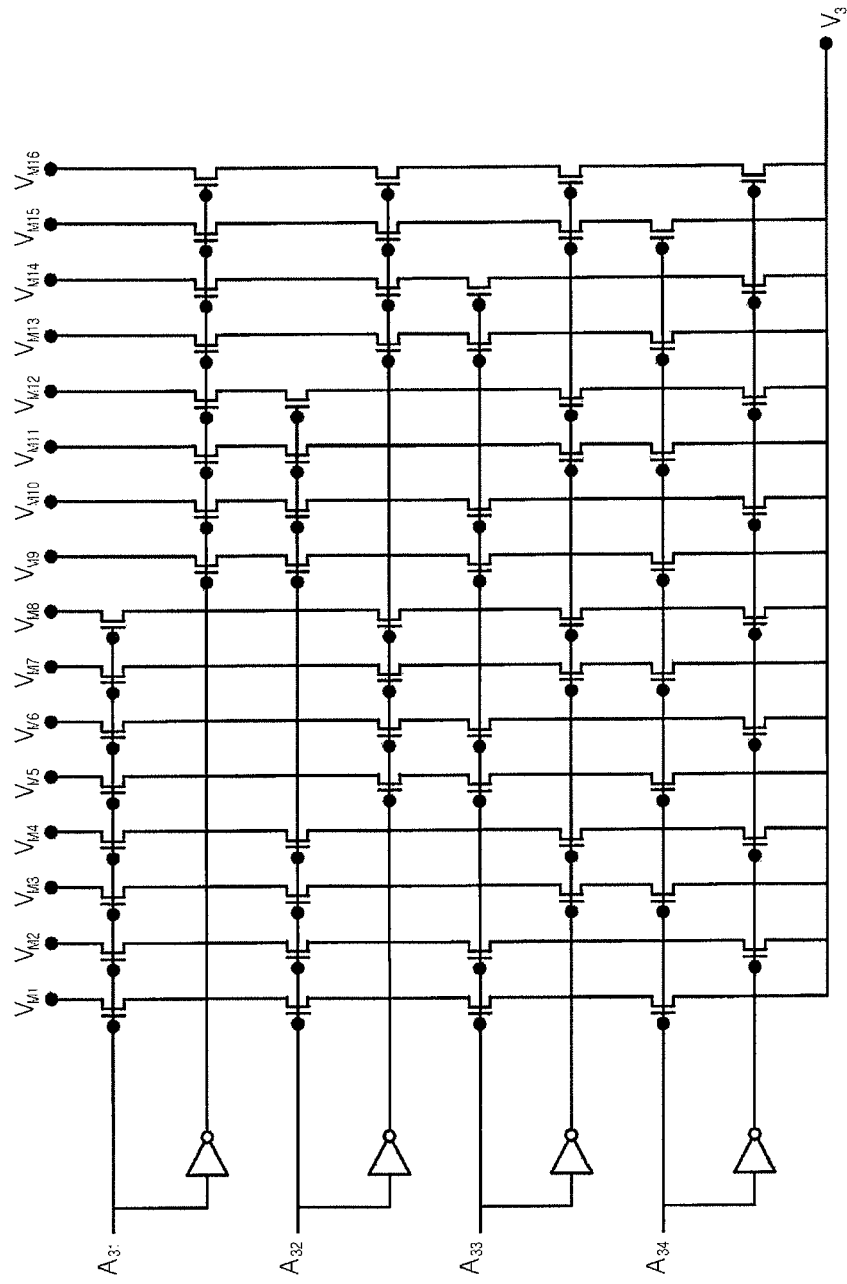
Figure 5D:
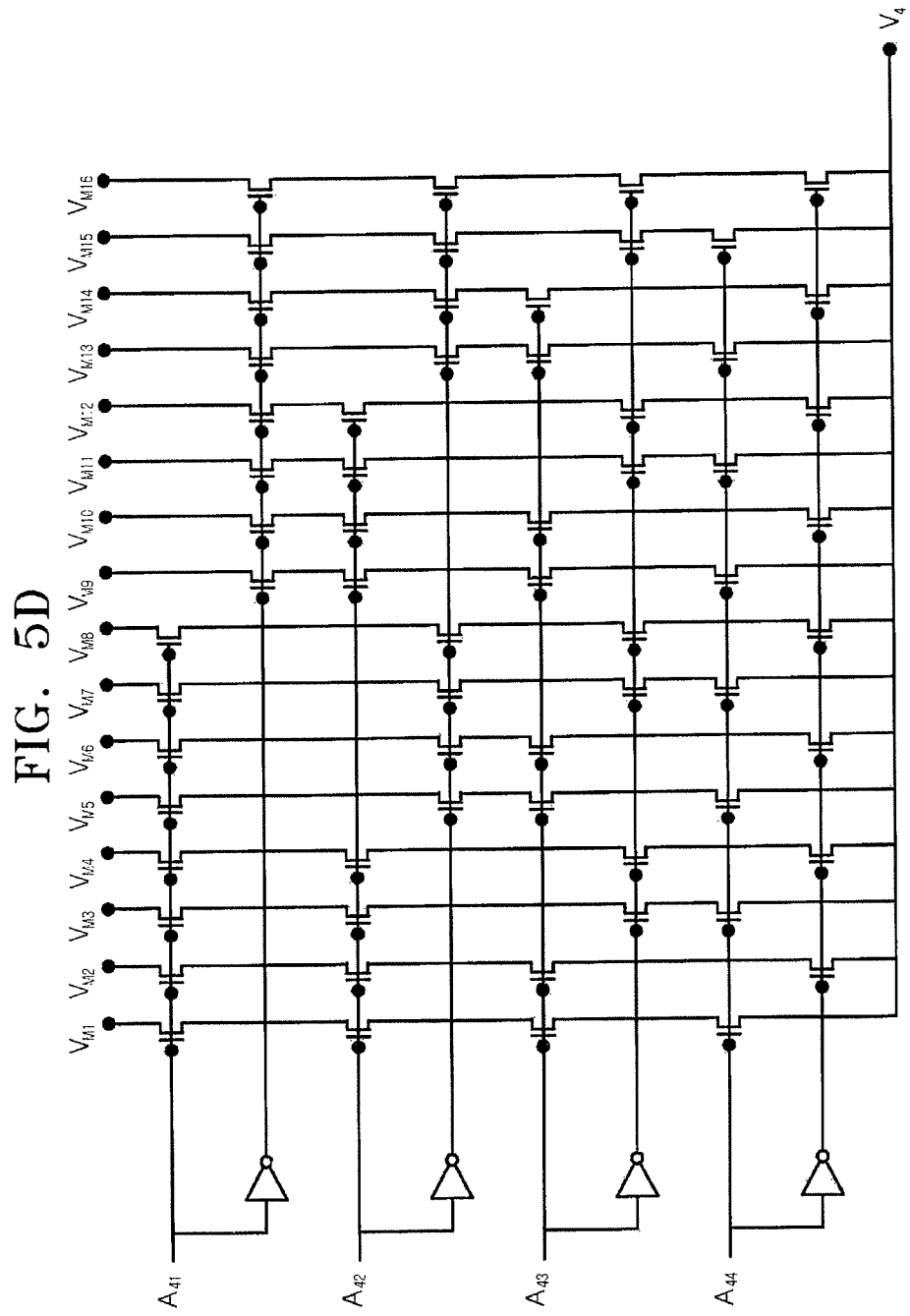

FIGS. 5A to 5D are circuit diagrams of the divided voltage mapping unit forming the voltage division unit of FIG. 2. FIG. 5A is a detailed circuit diagram of the divided voltage mapping unit configured to select any one of $2^4$ divided voltages $V_{M1}$ to $V_{M16}$ generated by the divided voltage generation unit 121 as a voltage $V_1$ through four-bit data $A_{11}$ to $A_{14}$ stored in the first channel memory 111. FIG. 5B is a detailed circuit diagram of the divided voltage mapping unit configured to select any one of the $2^4$ divided voltages $V_{M1}$ to $V_{M16}$ generated by the divided voltage generation unit 121 as a voltage $V_2$ through four-bit data $A_{21}$ to $A_{24}$ stored in the second channel memory 112. FIG. 5C is a detailed circuit diagram of the divided voltage mapping unit configured to select any one of the $2^4$ divided voltages $V_{M1}$ to $V_{M16}$ generated by the divided voltage generation unit 121 as a voltage $V_3$ through four-bit data $A_{31}$ to $A_{34}$ stored in the third channel memory 113. FIG. 5D is a detailed circuit diagram of the divided voltage mapping unit configured to select any one of the $2^4$ divided voltages $V_{M1}$ to $V_{M16}$ generated by the divided voltage generation unit 121 as a voltage $V_4$ through four-bit data $A_{41}$ to $A_{44}$ stored in the fourth channel memory 114.

Referring to FIGS. 5A to 5D, the divided voltage mapping unit 122 selects the $2^N$ divided voltages corresponding to n-bit digital input channel selection number from the $2^N$ divided voltage $V_M(i)$ of the divided voltage generation unit 121 through the programmable dynamic data provided from the n-bit channel data storage unit 110, and maps the selected $2^n$ divided voltages to the $2^N$ applied voltages V(j) of the D/A conversion unit 130.

The divided voltage mapping unit 122 includes a plurality of switch strings each having a plurality of switches corresponding to n-bit data $A_{n1}$ to $A_{n0}$ provided from the n-bit channel data storage unit 110 and arranged in parallel so as to correspond to $2^n$ divided voltages set according to the n-bit digital input channel selection number. The n-bit data $A_{n1}$ to $A_{n4}$ provided from the n-bit channel data storage unit 110 are directly inputted or inverted through inverters and then inputted to the gates of the switches forming each of the switch strings, and any one of the divided voltages corresponding to the digital input channel selection number is selected and outputted according to the on/off operations of the respective switches of the switch string. Each of the switches of the switching string may be implemented with a MOS transistor.

Figure 6:
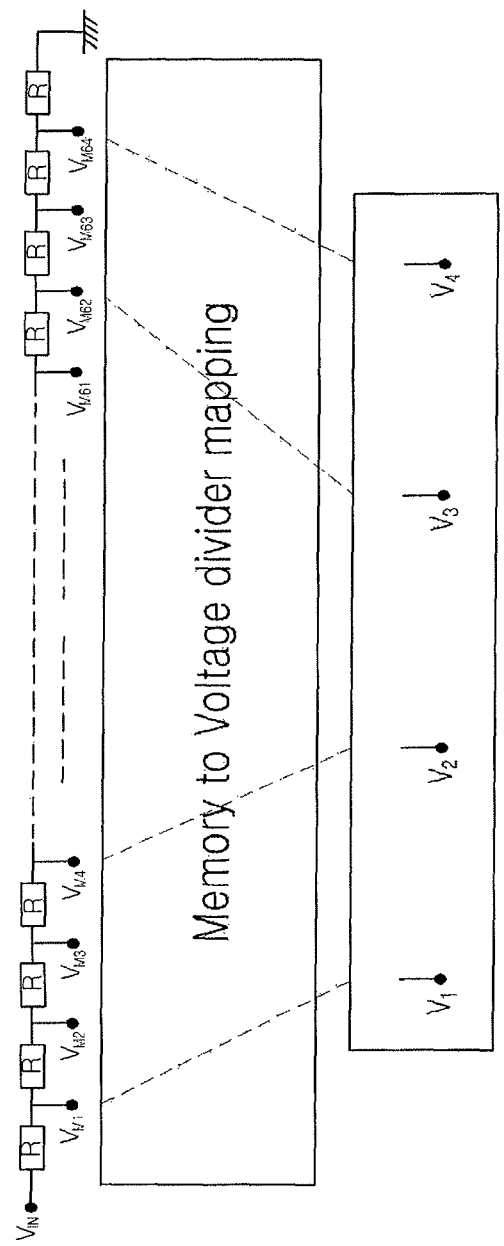
FIG. 6 is a diagram for explaining a voltage mapping operation between the voltage division unit and a D/A conversion unit in the programmable dynamic voltage control apparatus in accordance with the embodiment of the present invention.

FIG. 6 is a diagram for explaining a voltage mapping operation between the voltage division unit and the D/A conversion unit in the programmable dynamic voltage control apparatus in accordance with the embodiment of the present invention. FIG. 6 illustrates a process in which voltages $V_1$ to $V_4$ are mapped through the divided voltage mapping unit 122 of FIGS. 5A to 5D according to data stored in channel addresses $A_{11}$ to $A_{14}$, $A_{21}$ to $A_{24}$, $A_{31}$ to $A_{34}$, and $A_{41}$ to $A_{44}$ of the n-bit channel memories 111 to 114, respectively.

Tables 2 to 5 show the stored data of the channel addresses $A_{11}$ to $A_{14}$, $A_{21}$ to $A_{24}$, $A_{31}$ to $A_{34}$, and $A_{41}$ to $A_{44}$, respectively, which are used during the voltage mapping operation. Table 2 shows that a value mapped to the first voltage $V_1$ is set according to the setting data of the first channel address $A_{11}$ to $A_{14}$, Table 3 shows that a value mapped to the second voltage $V_2$ is set according to the setting data of the second channel address $A_{21}$ to $A_{24}$, Table 4 shows that a value mapped to the third voltage $V_3$ is set according to the setting data of the third channel address $A_{31}$ to $A_{34}$, and Table 5 shows that a value mapped to the fourth voltage $V_4$ is set according to the setting data of the fourth channel address $A_{41}$ to $A_{44}$. Tables 2 to 5 show a case in which the number of divided voltages is 16 and the number of selected channels is 4. However, this is only an example for promoting understanding of the present invention, and the present invention is not limited thereto.

TABLE 2

|  | $V_{M1}$ | $V_{M2}$ | $V_{M3}$ | $V_{M4}$ | $V_{M5}$ | $V_{M6}$ | $V_{M7}$ | $V_{M8}$ | $V_{M9}$ | $V_{M10}$ | $V_{M11}$ | $V_{M12}$ | $V_{M13}$ | $V_{M14}$ | $V_{M15}$ | $V_{M16}$ |
|---|---|---|---|---|---|---|---|---|---|---|---|---|---|---|---|---|
| $A_{11}$ | 1 | 1 | 1 | 1 | 1 | 1 | 1 | 1 | 0 | 0 | 0 | 0 | 0 | 0 | 0 | 0 |
| $A_{12}$ | 1 | 1 | 1 | 1 | 0 | 0 | 0 | 0 | 1 | 1 | 1 | 1 | 0 | 0 | 0 | 0 |
| $A_{13}$ | 1 | 1 | 0 | 0 | 1 | 1 | 0 | 0 | 1 | 1 | 0 | 0 | 1 | 1 | 0 | 0 |
| $A_{14}$ | 1 | 0 | 1 | 0 | 1 | 0 | 1 | 0 | 1 | 0 | 1 | 0 | 1 | 0 | 1 | 0 |

TABLE 3

|  | $V_{M1}$ | $V_{M2}$ | $V_{M3}$ | $V_{M4}$ | $V_{M5}$ | $V_{M6}$ | $V_{M7}$ | $V_{M8}$ | $V_{M9}$ | $V_{M10}$ | $V_{M11}$ | $V_{M12}$ | $V_{M13}$ | $V_{M14}$ | $V_{M15}$ | $V_{M16}$ |
|---|---|---|---|---|---|---|---|---|---|---|---|---|---|---|---|---|
| $A_{21}$ | 1 | 1 | 1 | 1 | 1 | 1 | 1 | 1 | 0 | 0 | 0 | 0 | 0 | 0 | 0 | 0 |
| $A_{22}$ | 1 | 1 | 1 | 1 | 0 | 0 | 0 | 0 | 1 | 1 | 1 | 1 | 0 | 0 | 0 | 0 |
| $A_{23}$ | 1 | 1 | 0 | 0 | 1 | 1 | 0 | 0 | 1 | 1 | 0 | 0 | 1 | 1 | 0 | 0 |
| $A_{24}$ | 1 | 0 | 1 | 0 | 1 | 0 | 1 | 0 | 1 | 0 | 1 | 0 | 1 | 0 | 1 | 0 |

TABLE 4

|  | $V_{M1}$ | $V_{M2}$ | $V_{M3}$ | $V_{M4}$ | $V_{M5}$ | $V_{M6}$ | $V_{M7}$ | $V_{M8}$ | $V_{M9}$ | $V_{M10}$ | $V_{M11}$ | $V_{M12}$ | $V_{M13}$ | $V_{M14}$ | $V_{M15}$ | $V_{M16}$ |
|---|---|---|---|---|---|---|---|---|---|---|---|---|---|---|---|---|
| $A_{31}$ | 1 | 1 | 1 | 1 | 1 | 1 | 1 | 1 | 0 | 0 | 0 | 0 | 0 | 0 | 0 | 0 |
| $A_{32}$ | 1 | 1 | 1 | 1 | 0 | 0 | 0 | 0 | 1 | 1 | 1 | 1 | 0 | 0 | 0 | 0 |
| $A_{33}$ | 1 | 1 | 0 | 0 | 1 | 1 | 0 | 0 | 1 | 1 | 0 | 0 | 1 | 1 | 0 | 0 |
| $A_{34}$ | 1 | 0 | 1 | 0 | 1 | 0 | 1 | 0 | 1 | 0 | 1 | 0 | 1 | 0 | 1 | 0 |

TABLE 5

|  | $V_{M1}$ | $V_{M2}$ | $V_{M3}$ | $V_{M4}$ | $V_{M5}$ | $V_{M6}$ | $V_{M7}$ | $V_{M8}$ | $V_{M9}$ | $V_{M10}$ | $V_{M11}$ | $V_{M12}$ | $V_{M13}$ | $V_{M14}$ | $V_{M15}$ | $V_{M16}$ |
|---|---|---|---|---|---|---|---|---|---|---|---|---|---|---|---|---|
| $A_{41}$ | 1 | 1 | 1 | 1 | 1 | 1 | 1 | 1 | 0 | 0 | 0 | 0 | 0 | 0 | 0 | 0 |
| $A_{42}$ | 1 | 1 | 1 | 1 | 0 | 0 | 0 | 0 | 1 | 1 | 1 | 1 | 0 | 0 | 0 | 0 |
| $A_{43}$ | 1 | 1 | 0 | 0 | 1 | 1 | 0 | 0 | 1 | 1 | 0 | 0 | 1 | 1 | 0 | 0 |
| $A_{44}$ | 1 | 0 | 1 | 0 | 1 | 0 | 1 | 0 | 1 | 0 | 1 | 0 | 1 | 0 | 1 | 0 |

Figure 7:
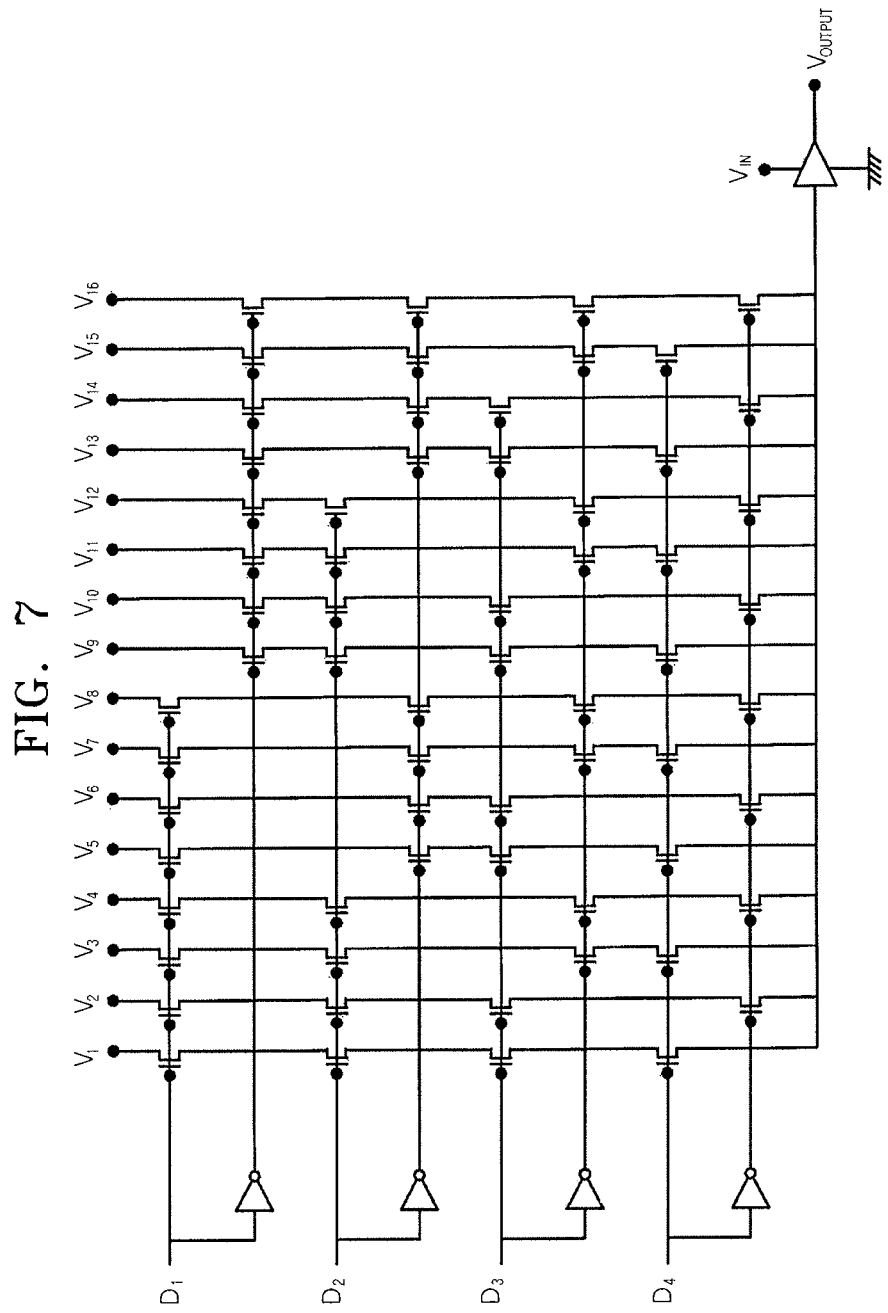
FIG. 7 is a circuit diagram of the D/A conversion unit of FIG. 2.

FIG. 7 is a circuit diagram of the D/A conversion unit of FIG. 2. The D/A conversion unit 130 includes a plurality of switch strings each having a plurality of switches corresponding to digital input signals D1 to Dn of n channels, sensed through the sensor of the vehicle. The plurality of switch strings are arranged in parallel to correspond to the $2^n$ divided voltages set according to the n-bit digital input channel selection number. The digital input signals D1 to Dn of the n channels, sensed through the sensor of the vehicle, are directly inputted or inverted through inverters and then inputted to the gates of the switches forming each of the switch strings, and the D/A conversion unit 130 may select and output any one of the divided voltages corresponding to the digital input channel selection number according to the on/off operations of the respective switches of each switch string. The drain terminals of the respective switch strings are commonly coupled to an input terminal of an op-amplifier to select and amplify one applied voltage V(j) for the n-th channel. Each of the switches of the switch string may be implemented with a MOS transistor.

The operation of the programmable dynamic voltage control apparatus in accordance with the embodiment of the present invention and the effect obtained through the operation will be described as follows.

First, when an input voltage Vin is supplied to the voltage division unit 120, the divided voltage generation unit 121 designed by reflecting a necessary number of steps as illustrated in FIGS. 4A to 4C generates $2^N$ divided voltages $V_M(i)$ through the nodes between the respective impedance elements of the impedance string including resistors where i ranges from 1 to $2^N$ and N is the number of necessary steps. At this time, when the number N of necessary steps is set to six, the nodes between the respective resistors of the divided voltage generation unit 121 may generate $2^N$ (64) divided voltages $V_{M1}$ to $V_{M64}$ because the impedance string includes ($2^N$+1) resistors, that is, 65 resistors as illustrated in FIG. 4A. When the number N of necessary steps is set to eight, the nodes between the respective resistors of the divided voltage generation unit 121 may generate $2^N$ (256) divided voltages $V_{M1}$ to $V_{M256}$ because the impedance string includes ($2^N$+1) resistors, that is, 257 resistors as illustrated in FIG. 4B. When the number N of necessary steps is set to 10, the nodes between the respective resistors of the divided voltage generation unit 121 may generate $2^N$ (1024) divided voltages $V_{M1}$ to $V_{M64}$ because the impedance string includes ($2^N$+1) resistors, that is, 1025 resistors as illustrated in FIG. 4C.

Then, the n-bit channel data storage unit 110 provides one or more programmable dynamic data, which are previously programmed and stored to set a four-bit digital input channel selection number and divided voltages corresponding to the four-bit digital input channel selection number, to the voltage division unit 120. Hereafter, a case in which four-bit dynamic data are provided will be taken as an example for description.

Thus, the divided voltage mapping unit 122 of the voltage division unit 120 selects 16 divided voltages corresponding to the four-bit digital input channel selection number from the $2^N$ divided voltages $V_M(i)$ using the programmable dynamic data provided from the n-bit channel data storage unit 110 (refer to Tables 1 to 5) according to the circuit configuration illustrated in FIGS. 5A to 5D, and stably maps the selected divided voltages to $2^n$ (16) applied voltages V(j) of the D/A conversion unit 130.

Then, the D/A conversion unit 130 receives the $2^n$ applied voltage V(j) mapped through the programmable dynamic data from the voltage division unit 120, and receives the digital sensor signals D1 to Dn sensed through the sensor of the vehicle as data signals of four channels as illustrated in FIG. 7, and controls the on/off operation for the switches of each switch string. Thus, the output terminal of the amplifier may output an analog signal Aout which is dynamically and equally divided in response to the digital input signal of each channel.

Thus, when the output unit converts signals sensed through various sensors mounted on the vehicle into electrical signals and then transmits the electrical signals, the voltage may be converted and outputted to correspond to the setting value stored in the storage unit while the input digital signal is converted into the analog signal. The entire system may be simplified to thereby reduce the cost.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A programmable dynamic voltage control apparatus comprising:
    an n-bit channel data storage unit configured to store an n-bit digital input channel selection number and one or more programmable dynamic data for setting divided voltages corresponding to the n-bit digital input channel selection number, and provide the stored n-bit digital input channel selection number and dynamic data for setting the $2^n$ divided voltages to a voltage division unit;
    the voltage division unit configured to equally divide an input voltage to generate $2^N$ divided voltages $V_M(i)$ where i ranges from 1 to $2^N$ and N is the number of necessary steps, select the $2^n$ divided voltages corresponding to the n-bit digital input channel selection number from the $2^N$ divided voltages $V_M(i)$ through the programmable dynamic data provided from the n-bit channel data storage unit, and maps the selected $2^n$ divided voltages to $2^n$ applied voltages V(j) of a D/A conversion unit; and
    the D/A conversion unit configured to be turned on/off by receiving the $2^n$ applied voltage V(j) mapped through the programmable dynamic data and receiving a digital sensor signal sensed through a sensor of a vehicle as input signals of n channels, and output an analog signal corresponding to the digital input signal of each channel.

2. The programmable dynamic voltage control apparatus of claim 1, wherein the n-bit channel data storage unit stores the n-bit digital input channel selection number and the one or more programmable dynamic data for setting the $2^n$ divided voltages corresponding to the n-bit digital input channel selection number into n-bit channel memories corresponding to the respective n digital input channels.

3. The programmable dynamic voltage control apparatus of claim 1, wherein the n-bit channel data storage unit comprises a nonvolatile RAM which maintains data stored therein even though power supply is cut off.

4. The programmable dynamic voltage control apparatus of claim 1, wherein the voltage division unit comprises:
    a divided voltage generation unit including an impedance string to equally divide the input voltage into $2^N$ voltages and configured to generate $2^N$ divided voltages $V_M(i)$ at each node of the impedance string where i ranges from 1 to $2^N$ and N is the number of necessary steps; and
    a divided voltage mapping unit configured to select the $2^N$ divided voltages corresponding to the n-bit digital input channel selection number from the $2^N$ divided voltages $V_M(i)$ of the divided voltage generation unit through the programmable dynamic data provided from the n-bit channel data storage unit, and map the selected $2^n$ divided voltages to the $2^n$ applied voltages V(j) of the D/A conversion unit.

5. The programmable dynamic voltage control apparatus of claim 4, wherein the divided voltage generation unit comprises the impedance string having $(2^N+1)$ impedance elements for equally dividing the input voltage into the $2^N$ divided voltages $V_M(i)$, and generates the $2^N$ divided voltages through at each node between the respective impedance elements of the impedance string.

6. The programmable dynamic voltage control apparatus of claim 5, wherein the respective impedance elements forming the impedance string are implemented with resistors having the same impedance value.

7. The programmable dynamic voltage control apparatus of claim 4, wherein the divided voltage mapping unit comprises a plurality of switch strings each having a plurality of switches corresponding to n-bit data provided from the n-bit channel data storage unit and arranged in parallel to correspond to the $2^n$ divided voltages set according to the n-bit digital input channel selection number, and
    the n-bit data are directly inputted to or inverted through inverters and then inputted to gates of the switches forming each of the switch strings, and any one of the divided voltages corresponding to the digital input channel selection number is selected and outputted according to the on/off operations of the respective switches of the switch string.

8. The programmable dynamic voltage control apparatus of claim 1, wherein the D/A conversion unit comprises a plurality of switch strings each having a plurality of switches corresponding to the digital input signals of the n channels sensed through the sensor of the vehicle and arranged in parallel to correspond to the $2^n$ divided voltages according to the n-bit digital input channel selection number,
    the digital input signals of the n channels, sensed through the sensor of the vehicle, are directly inputted to or inverted through inverters and then inputted to gates of the switches forming each of the switch strings, and any one of the divided voltages corresponding to the digital input channel selection number is selected and outputted according to the on/off operations of the respective switches of the switch string, and
    the drain terminals of the respective switch strings are commonly coupled to an input terminal of an op-amplifier to select and amplify one applied voltage V(j) for the n-th channel.

* * * * *